United States Patent [19]
Takashi et al.

[11] Patent Number: 6,034,998
[45] Date of Patent: Mar. 7, 2000

[54] METHOD OF AND APPARATUS FOR DETECTING PHASE

[75] Inventors: Terumi Takashi, Chigasaki; Akihiko Hirano, Odawara, both of Japan

[73] Assignee: Hitachi, Ltd., Tokyo, Japan

[21] Appl. No.: 08/674,864

[22] Filed: Jul. 3, 1996

[30] Foreign Application Priority Data

Jul. 4, 1995 [JP] Japan .................................. 7-168499

[51] Int. Cl.⁷ .................................................. H04L 25/49
[52] U.S. Cl. .......................................... 375/294; 375/376
[58] Field of Search ..................................... 327/141, 159; 329/301–303, 311, 314, 317, 321; 331/1 A, 1 R, DIG. 2, 14, 17, 20; 360/18, 46, 51, 65, 78.14; 375/286, 290, 291, 293, 294, 229, 232, 376

[56] References Cited

U.S. PATENT DOCUMENTS

| | | | |
|---|---|---|---|
| 4,672,632 | 6/1987 | Andersen | 375/57 |
| 4,851,932 | 7/1989 | Scheer et al. | 360/51 |
| 5,265,125 | 11/1993 | Ohta | 375/290 |
| 5,430,768 | 7/1995 | Minuhin et al. | 375/340 |
| 5,459,757 | 10/1995 | Minuhin et al. | 375/376 |
| 5,585,975 | 12/1996 | Bliss | 360/65 |

*Primary Examiner*—Stephen Chin
*Assistant Examiner*—Mohammad Ghayour
*Attorney, Agent, or Firm*—Antonelli, Terry, Stout & Kraus, LLP

[57] ABSTRACT

A phase-locked loop included in a reproduce signal processing circuit which as a magnetic recording and reproducing device or the like. The phase-locked loop accurately detects a phase and can be operated at high speed. The phase-locked loop includes a data determining circuit for judging data at individual times from sampled data in a plurality of samples and an estimated data string generating circuit for examining the correlation between each data string and each known phase-locked data string and sequentially generating the known phase-locked data string closet to the data string. A sampling phase is detected by performing an arithmetic operation on the data string estimated by the estimated data string generating circuit and the sampled data.

3 Claims, 10 Drawing Sheets

DATA STRING ESTIMATE

| sgn(n-3) | sgn(n-2) | sgn(n-1) | sgn(n) | y^(n-3) y^(n-2) y^(n-1) y^(n) |
|---|---|---|---|---|
| + | + | − | − | |
| + | − | − | − | |
| + | + | − | + | +1  +1  −1  −1 |
| − | − | − | − | |
| + | − | − | + | |
| − | − | − | + | |
| + | − | + | + | +1  −1  −1  +1 |
| − | + | − | + | |
| − | − | + | + | |
| − | − | + | − | |
| − | + | + | + | −1  −1  +1  +1 |
| + | + | + | + | |
| − | + | + | − | |
| − | + | − | − | |
| + | + | + | − | −1  +1  +1  −1 |
| + | − | + | − | |

PHASE LOCK OPERATION

| RG | MSEL | ŷ(n-1) | ŷ(n) | PHASE | ERRORS |
|---|---|---|---|---|---|
| 1 | 0 | −1 | −1 | y(n) | −y(n−1) |
| ↓ | ↓ | −1 | +1 | y(n) | +y(n−1) |
|  |  | +1 | +1 | −y(n) | +y(n−1) |
|  |  | +1 | −1 | −y(n) | −y(n−1) |

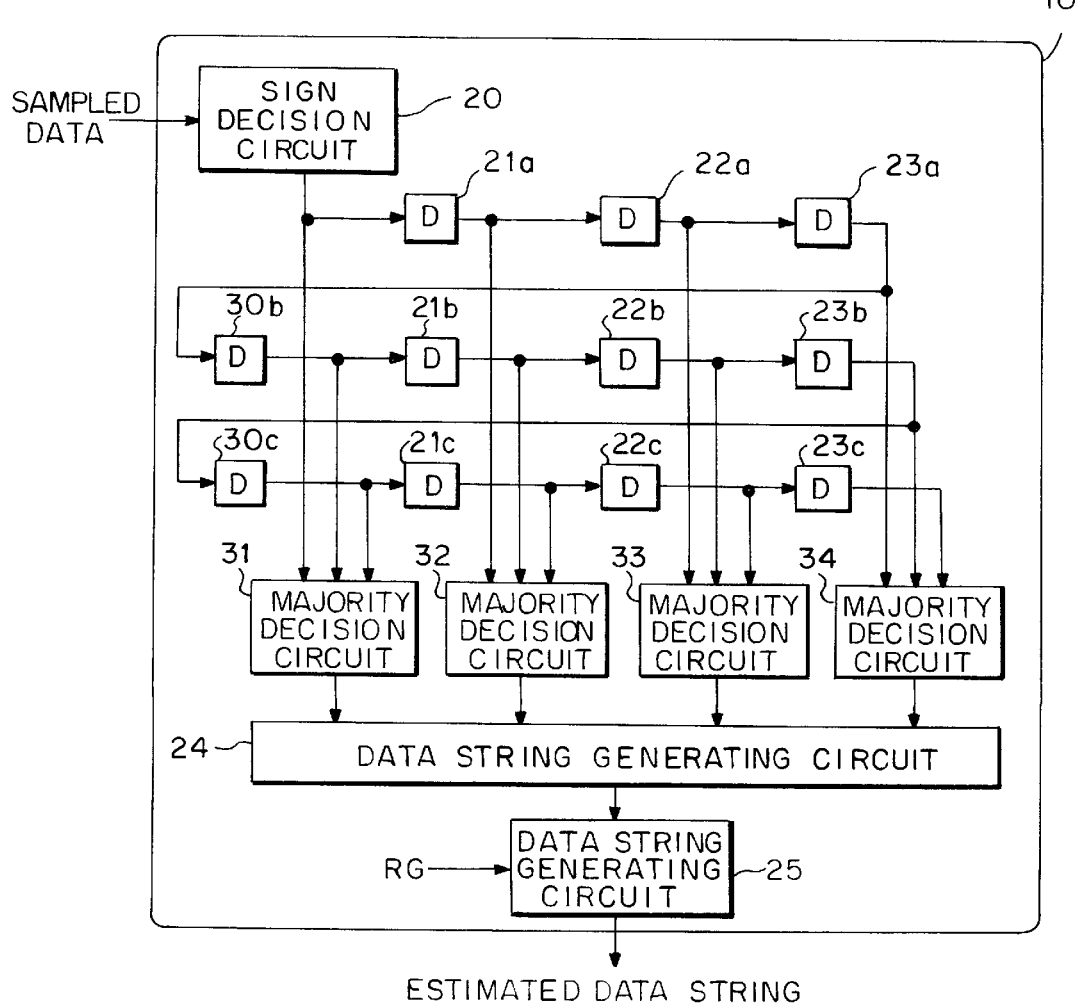

| sgn(n) | sgn(n-4) | sgn(n-8) | sgn^(n) |
|---|---|---|---|
| + | + | + | + |
| + | + | − | + |
| + | − | + | + |
| + | − | − | − |
| − | + | + | + |
| − | + | − | − |
| − | − | + | − |
| − | − | − | − |

FIG. 13

| sgn(n-3) | sgn(n-2) | sgn(n-1) | sgn(n) | | y^(n-3) | y^(n-2) | y^(n-1) | y^(n) |
|---|---|---|---|---|---|---|---|---|
| 1 | 0 | -1 | 0 | | 1 | 0 | -1 | 0 |
| 1 | 0 | -1 | -1 | | | | | |
| 1 | 1 | 0 | -1 | | | | | |
| 1 | 1 | -1 | 0 | | | | | |
| 0 | 1 | -1 | -1 | | | | | |
| 1 | 1 | -1 | -1 | | | | | |
| 0 | -1 | 0 | 1 | | 0 | -1 | 0 | 1 |
| 0 | -1 | -1 | 1 | | | | | |
| 1 | 0 | -1 | 1 | | | | | |
| 1 | -1 | 0 | 1 | | | | | |
| 1 | -1 | -1 | 0 | | | | | |
| 1 | -1 | -1 | 1 | | | | | |
| -1 | 0 | 1 | 0 | | -1 | 0 | 1 | 0 |
| -1 | -1 | 1 | 0 | | | | | |
| 0 | -1 | 1 | 1 | | | | | |
| -1 | 0 | 1 | 1 | | | | | |
| -1 | -1 | 0 | 1 | | | | | |
| -1 | -1 | 1 | 1 | | | | | |
| 0 | 1 | 0 | -1 | | 0 | 1 | 0 | -1 |
| -1 | 1 | 0 | -1 | | | | | |
| -1 | 1 | 1 | 0 | | | | | |
| 0 | 1 | 1 | -1 | | | | | |
| -1 | 0 | 1 | -1 | | | | | |
| -1 | 1 | 1 | -1 | | | | | |

METHOD OF AND APPARATUS FOR DETECTING PHASE

BACKGROUND OF THE INVENTION

The present invention relates to a phase-locked loop. More particularly the present invention relates to a method and apparatus usable in an information recording and reproducing device for detecting a sampling phase of a signal read by a signal reproducing circuit in an optical recording and reproducing device.

In general, an information recording and reproducing device such as a hard disk is equipped with a phase-locked loop or device to generate a sampling clock synchronized with a signal read from a data recording medium. The phase-locked loop performs phase synchronization based on a synchronizing signal having a predetermined period prior to the commencement of a data reproducing operation and thereafter performs a phase follow-up operation for data reproduction. As one type of conventional apparatus phase-locked loop, there is known a phase-locked loop or device for detecting a phase difference from sampled data obtained by sampling a read signal so as to generate a sampling clock. This type of phase-locked loop requires an improvement in the accuracy of detecting the phase difference to stabilize a phase lock or to conduct synchronous operation. According to a phase-locked loop or device disclosed in Japanese Patent Application Laid-Open No. 1-143447, for example, there is disclosed apparatus wherein data is reliably judged by changing a decision level of sampled data on the basis of the past decision data thereby stably detecting a phase difference.

The above-described conventional phase-locked loop must allow for a reliable decision or determination of sampled data by enhancing the accuracy of detecting the phase difference and completing the decision of the sampled data. The accuracy of detection of the phase difference must be insured each time the sampling clock is input. Therefore, a data decision circuit employed using the above-described conventional phase-locked loop makes a data decision using a so-called feedback circuit for performing the present data decision in correspondence with the past decision result. However, the feedback circuit interferes with high-speed operation of the phase-locked loop as the sampling clock is speeded up, thereby making it difficult to operate the phase-locked loop at high speed.

SUMMARY OF THE INVENTION

An object of the present invention is to provide a method and apparatus for accurately detecting a phase, thereby improving the accuracy of detecting a phase difference under phase synchronous and high-speed operation of a phase-locked loop.

To achieve the object of the present invention, the present invention provides a data determining circuit for making a decision relative to each sampled data of a plurality of samples, a storage circuit for storing a contiguous sequence of results of decisions on sampled data of a plurality of samples, a data string estimating circuit for estimating a data sequence or string from the results of the decisions on the sampled data of the plurality of samples and a phase detecting circuit for processing the data estimated by the data string estimating apparatus and each sampled data so as to determine a phase difference.

Further, the object of the present invention can also be achieved by providing a filter for eliminating a dc component of each sampled data, thereby allowing the data determining circuit, the data string estimating circuit and the phase detecting circuit to detect the phase difference based on the sampled data from which the dc component has been eliminated.

Still further, the object of the present invention can be achieved by providing a comparator for comparing the result of a decision by the data determining circuit and the data string estimated by the data string estimating circuit in addition to the provision of the above apparatus.

Prior to the initiation of a data reproducing operation, a phase-locked loop performs a phase lock or synchronous operation on the basis of a synchronizing signal having a fixed period set in advance. A phase-locked data sequence or string employed in a signal reproduction system is, for example, a partial response—Class IV (1, 0, −1) (hereinafter abbreviated as PR-4 (1, 0, −1)) is repetitive data of (1, 1, −1, −1) and is also a sinusoidal signal having a frequency corresponding to one-fourth the frequency of a sampling clock. The data determining circuit compares data for each sampling and a reference value (0 herein) and makes a decision as to whether the data is 1 or −1 according to the comparison. In the initial phase-locked state, the position where an error in decision or a misjudgment occurs, is displaced depending on the phases of the synchronizing signal and the sampling clock.

When sampled data is 180° out-of-sampling phase, for example, the amplitude of each sampled data, which is adjacent to 0 and the amplitude of each sampled data close to the peak are alternately produced. The sampled data whose amplitude is adjacent to 0, is small in difference as compared with the criterion of judgement and tends to cause a misjudgment. On the other hand, the sampled data whose amplitude is close to the peak, is large in difference as compared with the criterion of judgement and is hard to cause an error in judgement. Accordingly, the risk of mistaking all the determined data is extremely low.

The whole data string can be estimated from the individual sampling data by comparing each data string stored in the storage circuit and the predetermined phase-locked data string. As a result, the accuracy of detecting a phase difference obtained by performing an arithmetic operation on the data string and the sampled data can be enhanced. Further, since each of the data determining circuit and data string estimating circuit does not include a feedback circuit, the speed of the phase detecting circuit can be increased.

When a dc component is included in an input signal, there may be cases where an error in data decision tends to arise and the data string estimating circuit malfunctions. On the other hand, a filter when used eliminates the dc component from each sampling data so as to reduce the misjudgment of the data determining circuit. As a result, the data string can be estimated with higher accuracy and the accuracy of detecting the phase can be improved.

Further, the comparator compares the data string determined by the data string estimating circuit and the result of data decision and detects an error in the data-string estimation from the result of the comparison. When the estimated data string is misjudged for some reason, the phase detection is not normally done so that phase synchronization is not completed. Thus, the phase synchronization can be reliably completed by estimating the data string again so as to detect the phase difference when the comparator has made the misjudgment. Since neither the filter or the comparator serves as a feedback circuit, they do not interfere with the increase in speed of the phase detecting circuit.

BRIEF DESCRIPTION OF THE DRAWINGS

The present invention will be more apparent from the following detailed description, when taken in conjunction with the accompanying drawings, in which:

FIG. 2 is a view for describing a control sequence of the phase-locked loop shown in FIG. 1;

FIGS. 3A–3C are truth-value tables for describing a method of estimating a first data string and computing phase differences according to the present invention;

FIG. 4 is a block diagram illustrating another example of an estimated data string generating circuit shown in FIG. 1;

FIG. 13 is a truth-value table showing data-string estimates obtained by the third embodiments of the phase-locked loop according to the present invention.

DETAILED DESCRIPTION OF THE PREFERRED EMBODIMENTS

Figure 1:
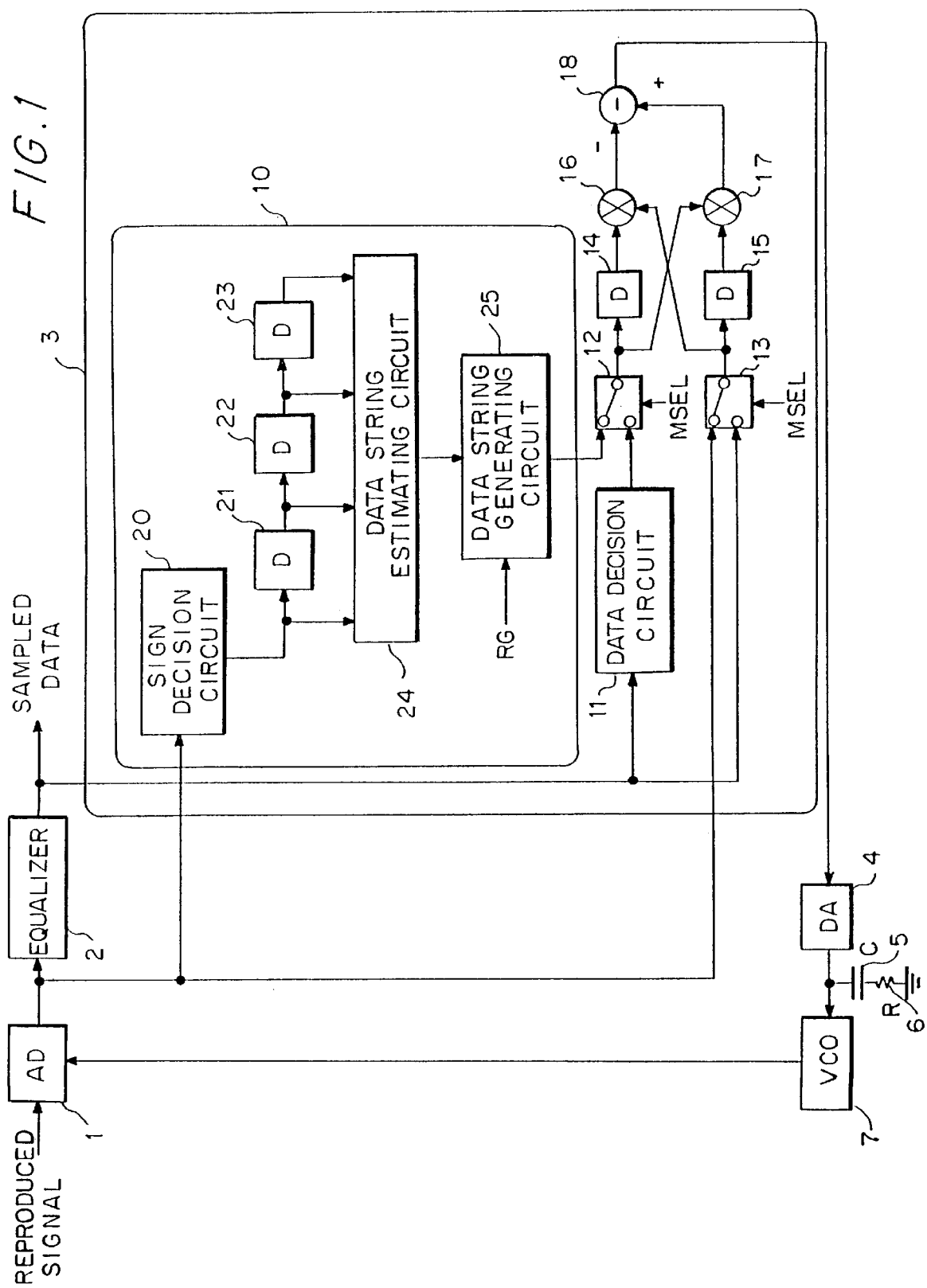
FIG. 1 is a block diagram illustrating a first embodiment of a phase-locked loop according to the present invention.

A first embodiment of the present invention will hereinafter be described with reference to FIG. 1. FIG. 1 is a block diagram showing a phase-locked loop of a signal reproduction-system circuit of Class PR-4 (1, 0, −1). The phase-locked loop may be embodied as a large scale integrated (LSI) semiconductor integrated circuit chip or other such apparatus.

The phase-locked loop of the present invention can operate at a frequency of at least 20 Mega-bytes per second (MB/s) and has a processing speed of 5 nano-seconds. In the first embodiment, a phase-locked data string will be described as a repeated data string of {+1, +1, −1, −1}. The phase-locked loop is composed of an open-loop type control loop circuit which consists of a sampling circuit namely an analog to digital (AD) converter 1, an equalizer 2, a phase detector circuit 3, a digital to analog (DA) converter 4, a capacitor 5, a resistor 6 and a voltage-controlled oscillator (VCO) 7.

A reproduced signal, which is an analog signal, is sampled by the AD converter 1 in accordance with a sampling clock generated from the VCO 7. The equalizer 2 eliminates waveform distortion from the sampled data produced from the AD converter 1. The phase detecting circuit 3 receives therein the sampled data corresponding to the output produced from the AD converter 1 and the equalized data corresponding to the output of the equalizer 2 and determines the error or difference between the phase of the input data and a target sampling phase from the computation of the sampled data.

An object of the present invention is to provide a phase detecting method and apparatus capable of simultaneously performing an improvement in the accuracy of detecting a phase under phase lock or synchronous operation and an improvement in high-speed phase lock operation. Particularly, the phase detecting circuit 3 provides a basic configuration for achieving the above object.

The phase detecting circuit 3 comprises an estimated data string generating circuit 10 for estimating a phase-locked data string from the sampled data upon phase synchronization, a data decision circuit 11 for determining data from the data outputted from the equalizer 2 upon data follow-up operation, selectors 12 and 13 for determining a difference in phase between the data string and the sampled data, delay circuits 14 and 15, multipliers 16 and 17 and a subtracter 18.

Figures 2, 3A, 3B:
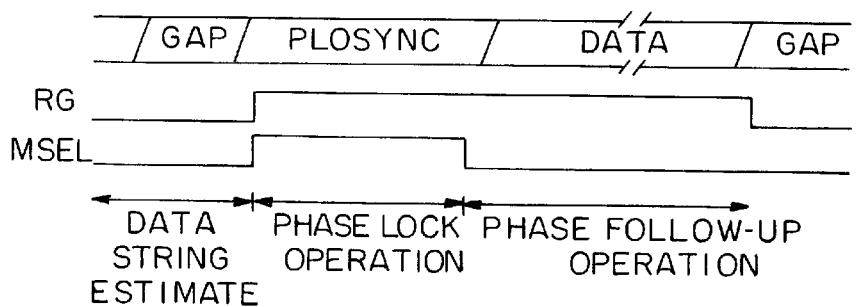

The operation of the phase detecting circuit 3 is decided based on control signal RG and MSEL. Each of the control signals varies in level as shown in FIG. 2. (1) When RG="L", the phase detecting circuit 3 estimates a phase-locked data string from sampled data. (2) When RG="H" and MSEL="H", the phase detecting circuit 3 performs a phase lock operation at the start of data reproduction. (3) When RG="H" and MSEL="L", the phase detecting circuit 3 performs a phase follow-up operation subsequent to the phase lock operation. The operation of the phase detecting circuit 3 will be described in detail in accordance with the states of the RG signal and the MSEL signal.

(1) Phase-locked Data String Estimate Operation (RG="L"):

The operation for estimating a phase-locked data string immediately before the commencement of phase lock operation is performed by the estimated data string generating circuit 10. The estimated data string generating circuit 10 includes a sign decision circuit 20, delay circuits 21, 22 and 23, a data string estimating circuit 24 and a data string generating circuit 25.

The sign decision circuit 20 makes a decision about the sign or code of the sampling data corresponding to the output of the AD converter 1. If the sampling data is found to be negative, then the sign decision circuit 20 outputs a signal corresponding to the sign of "−" to the delay circuit 21 and the data string estimating circuit 24. If the sampling data is found to be positive, then the sign decision circuit 20 outputs a signal corresponding to the sign of "+" to the delay circuit 21 and the data string estimating circuit 24.

Each of the delay circuits 21, 22 and 23 constitutes a so-called shift register which transmits an input supplied to each delay circuit to the output thereof each time one sampling clock is inputted. Assuming now that the result of the sign decision at the present time is represented as sgn(n) the result of the sign decision obtained antecedent to one sampling clock is represented as sgn(n−1) and the subsequent results of sign decisions are respectively represented as sgn(n−2) and sgn(n−3). The outputs of the sign decision circuit 20, the delay circuit 21, the delay circuit 22 and the delay circuit 23 are brought to sgn(n), sgn(n-1), sgn(n−2) and sgn(n−3) respectively.

The data string estimating circuit 24 estimates data strings on the basis of the results of data decisions about sgn(n) through sgn(n−3). Noting that the phase-locked data string is a repetition of (+1, +1, −1, −1), the data string estimating circuit 24 estimates data strings over the results of data decisions as shown in FIG. 3(a). When the result of data decision is represented as sgn(n−3, n−2, n−1, n)={+, +, −, −}, for example, an estimated data string y^(n−3, n−2, n−1, n) is regarded as {+1, +1, −1, −1}. When the result of data decision is represented as sgn(n−3, n−2, n−1, n)={+, −, −, −}, it is considered that noise is mixed into sgn(n−2) and the result of data decision is found to be misjudged. Thus, the estimated data string y^(n−3, n−2, n−1, n) is regarded as {+1, +1, −1, −1}.

As described above, the data string estimating circuit 24 generates a data string considered to be the most reliable on the combination of all the results of data decisions according to the sample phase of the input signal and the magnitude of noise. When RG is changed from "L" to "H", the data string generating circuit 25 successively outputs a data string estimated by the data string estimating circuit 24 in order of y^(n−3), y^(n−2), y^(n−1), y^(n), y^(n−3), . . . with y^(n) as the head each time the sampling clock is inputted.

(2) Phase Lock Operation (RG="H" and MSEL="H"):

In phase lock operation, the data string estimated by the estimated data string generating circuit 10 and the sampled data outputted from the AD converter 1 are computed to determine the difference in phase therebetween, thereby synchronizing the phase of the input data with the target sampling phase. When MSEL="H", the selector 12 selects the result of estimation of the data string by the estimated data string generating circuit 10 and the selector 13 selects the sampled data of the AD converter 1. The phase difference is determined by the delay circuits 14 and 15, the multipliers 16 and 17 and the subtracter 18. The phase difference is given by the following equation 1 if represented in the form of an arithmetic expression.

$$z(n)=y(n-1)*y\hat{\ }(n)-y(n)*y\hat{\ }(n-1)$$ [Equation 1]

In the above equation 1, z(n) indicates a phase difference at the present time, y^(n) and y^(n−1) indicate estimated data respectively, and y(n) and y(n−1) indicate sampled data respectively. Phase differences under phase lock operation, which are calculated from the above equation 1, are represented as shown in FIG. 3B. The calculated phase difference is outputted from the DA converter 4 to a filter composed of the capacitor 5 and the resistor 6 as a current.

When a sampled phase leads, a current flows in the direction in which an electric charge stored in the capacitor 5 is discharged. On the other hand, when the sampled phase lags, a current flows in the direction in which an electric charge is stored in the capacitor 5. The VCO 7 generates a sampling clock of an oscillating frequency corresponding to a voltage applied across each of the capacitor 5 and the resistor 6. When the sampled phase leads as a result, the control voltage of the VCO 7 is reduced and the oscillating frequency is lowered, whereby the control in the direction of causing the sampled phase to lag is carried out. On the other hand, when the sampled phase lags, the control voltage of the VCO 7 rises and the oscillating frequency becomes high, whereby the control in the direction of causing the sampled phase to lead is done.

When the phase difference becomes "0" as a result of repetition of the above operation, the DA converter 4 does not perform the charging and discharging of current. Therefore, no potential is developed across the resistor 6 and the potential applied to the capacitor 5 also remains unchanged. Accordingly, only the voltage held by the capacitor 5 is applied to the VCO 7 as the control voltage of the VCO 7 and the sampling clock coincides with the frequency and phase of the input signal, whereby the phase synchronization of the sampling clock is completed.

(3) Phase Follow-up Operation (RG="H" and MSEL="L"):

The phase follow-up operation is effected to follow a slow phase variation such as a variation in the rotational speed of a motor or the like after completion of the phase synchronization. Since input data is not yet known upon phase detection at the phase follow-up operation, the data decision circuit 11 decides or determines the data based on the equalize data outputted from the equalizer 2.

The data decision circuit 11 compares the equalized data and a reference value. If the equalized data >+0.5 V, then the result of comparison is regarded as "+1". If the equalized data <−0.5 V, then the result of comparison is regarded as "−1" and the result of comparison is regarded as "0" in the case of the other condition in the first embodiment. The data decision circuit 11 outputs one of {−1, 0, +1} as y^(n). When MSEL="L", the selectors 12 and 13 respectively select the output of the data decision circuit 11 and the output of the equalizer 2 and perform the arithmetic operations (see equation 1) referred to above so as to produce phase differences. The individual phase differences are represented as shown in FIG. 3C.

Similarly to phase lock operation, each computed phase difference is outputted to the VCO 7 through the DA converter 4, the capacitor 5 and the resistor 6 so as to control the oscillating frequency of the VCO 7. As a result, the phase follow-up operation provides an operation for correcting the difference or shift between the phase of the input data and the target sampling phase whenever necessary thereby to follow up the phase variation.

Figure 12:
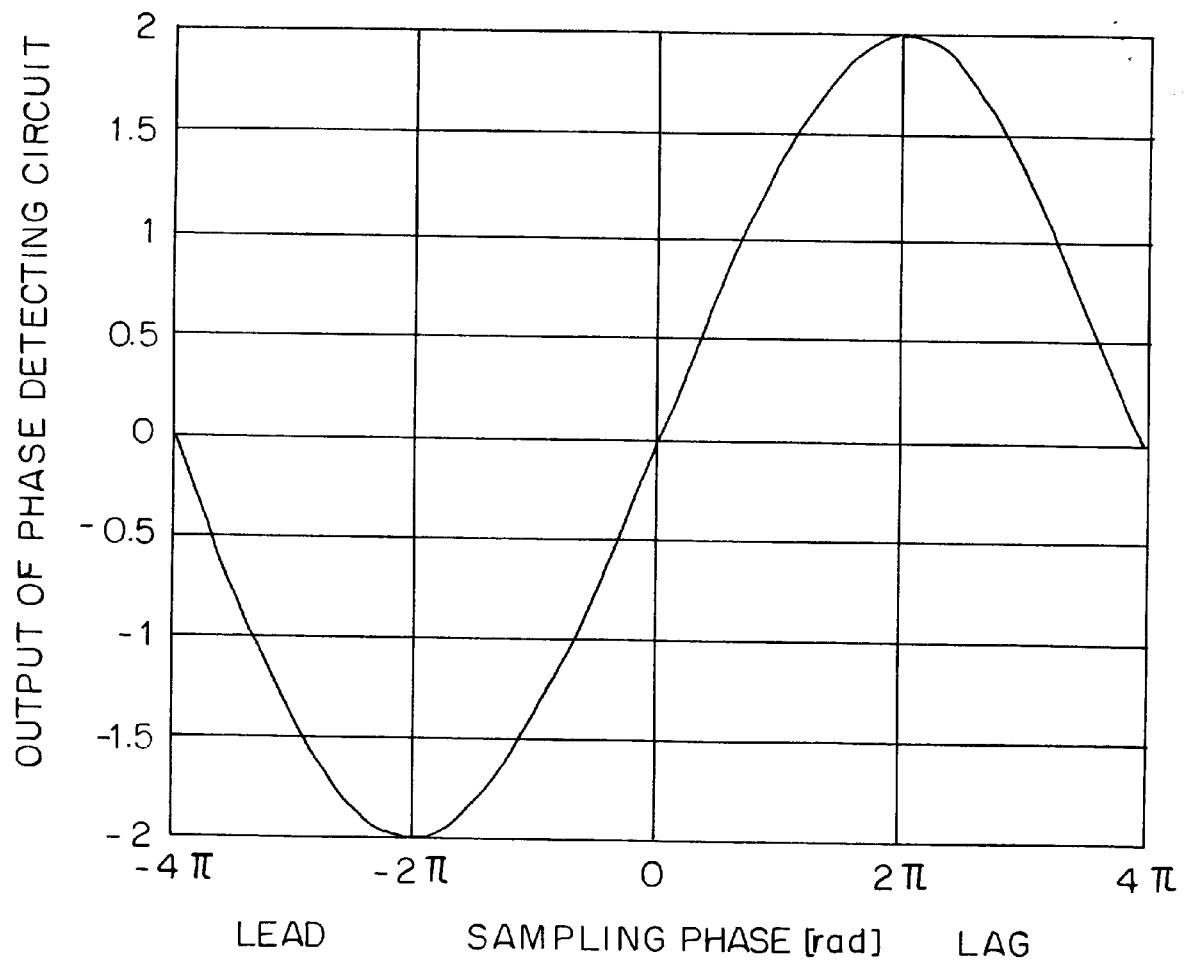
FIG. 12 is a graph illustrating a phase comparison characteristic obtained by a phase detecting method according to the present invention.

A phase comparison characteristic obtained in the above-described manner under phase lock operation is represented as shown in FIG. 12 so as to correspond to the sampling phase. According to the phase detecting circuit of the present system particular attention has been paid to the fact that the phase-locked data string is repeated, thus the output of the phase detecting circuit continuously increases even with respect to a phase difference of π [rad] or more or −π [rad] or less. Thus, phase synchronization can be provided from any sampling phase. Further, since a feedback circuit does not exist in the phase detecting circuit 3 including the data decision circuit 11, the phase detecting circuit 3 can be operated at high speed.

According to the data string decision made in the first embodiment, the data string estimates have been set so as to correspond to all the results of data decisions as shown in FIG. 3A. Of these, the result of data decision in which the frequency of occurrence is low, i.e., sgn(n−3, n−2, n−1, n)=(−, −, −, −), (−, +, −, +), (+, +, +, +), (+, −, +, −), is also subjected to the data string estimation so that a translation table is assigned thereto. There may however be cases where the detection of the result of data decision referred to above exerts a bad influence on phase synchronization. When the result of data decision referred to above is detected, the phase detection may be temporarily stopped so as to prevent the phase lock operation from being brought into an abnormal condition. A data reproduce operation may be stopped by notifying the above result of data decision to an external control circuit. The phase detection can be performed with more stability owing to the above-described construction.

The configuration of the estimated data string generating circuit 10 for estimating a data string with higher accuracy will now be described with reference to FIG. 4. The estimated data string generating circuit 10 shown in FIG. 1 estimates the data string from the result of sign decision corresponding to one period in the phase-locked data string. In the first embodiment, the data string is estimated from the results of sign decisions corresponding to a few periods in the phase-locked data string while attention is paid to the fact that the phase-locked data string is repeatedly produced.

In the first embodiment, a method of estimating data strings using the results of data decisions associated with a larger number of phase-locked data strings (corresponding to three periods in the first embodiment) will now be explained.

A sign decision circuit 20 makes a decision about the sign of sampled data in a manner similar to that shown in FIG. 1. Each of the results of sign decisions produced from the sign decision circuit 20 is stored in delay circuits 21a through 21c, 22a through 22c, 23a through 23c and 30b and 30c. Further, majority decision circuits 31, 32, 33 and 34 estimate data at individual times respectively.

Figures 5, 6:
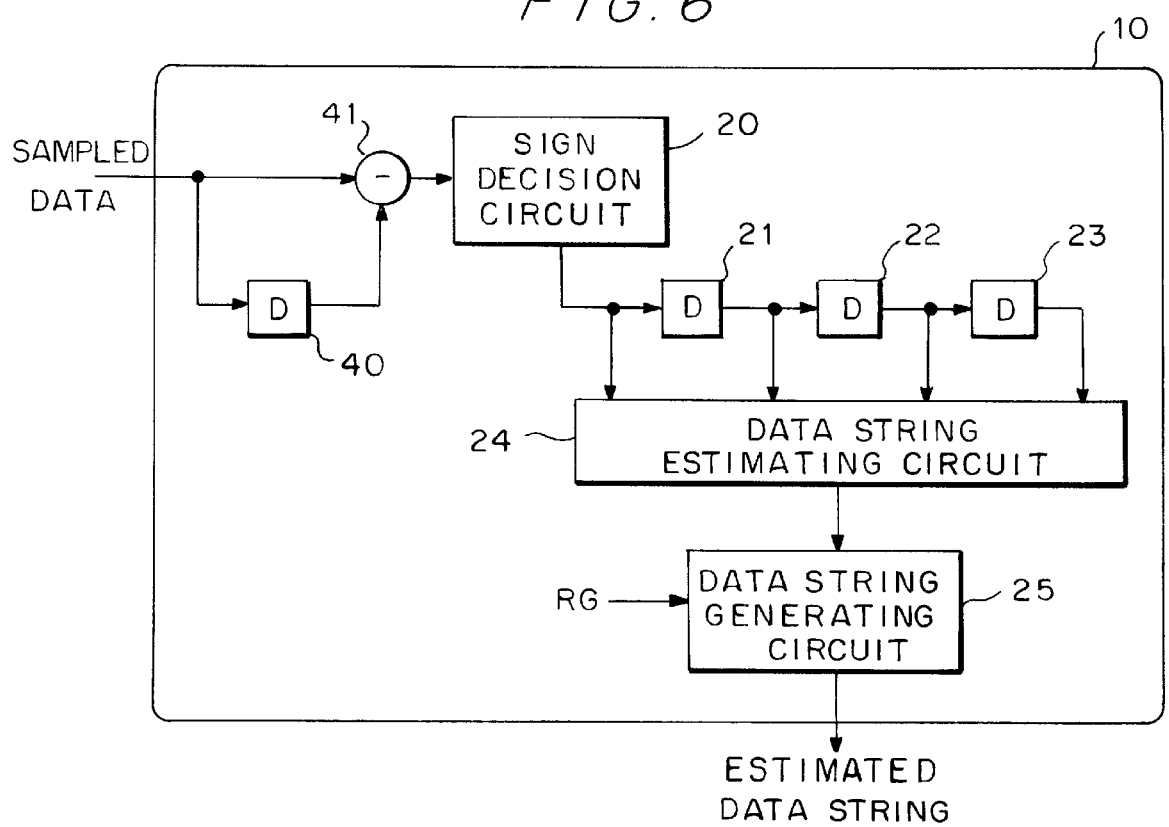
FIG. 5 is a truth-value table obtained from majority decision circuits shown in FIG. 4.
FIG. 6 is a block diagram illustrating a further example of the estimated data string generating circuit.

When the result of sign decision at the present time is regarded as sgn(n), the majority decision circuit 31 is supplied with the decision results corresponding to three samples of sgn(n), sgn(n−4) and sgn(n−8). Based on the input results, the majority decision circuit 31 generates the result of estimation sgn^(n) in accordance with a majority decision. A majority-decision determining method is carried out in accordance with a decision table shown in FIG. 5 thereby to estimate sgn^(n) from a combination of the results of sign decisions sgn(n), sgn(n−4) and sgn(n−8).

When sgn(n, n−4, n−8)={+, +, +}, for example, all the results of decisions are regarded to be correct and hence the output sgn^(n) of the majority decision circuit 31 is estimated as equal to "+" (i.e., sgn^(n)="+"). When sgn(n, n−4, n−8)={+, +, −}, the result of decision sgn(n−8) is judged to be incorrect due to noise or the like, so that sgn^(n) is estimated as equal to "+" (i.e., sgn^(n)="+") Each of the majority decision circuits 32, 33 and 34 uses the same determining method as described above except that the time at which the input data is provided, is equivalent to the time at the immediately preceding sample.

Thus, a data string estimating circuit 24 estimates data strings on the basis of sgn^(n−1), sgn^(n−2) and sgn^(n−3) estimated by the majority decision circuits 31 through 34. Next, when a RG signal changes from "L" to "H", a data string generating circuit 25 successively generates the data strings estimated by the data string estimating circuit 24. Subsequently, the phase lock operation and the phase follow-up operation are performed in a manner similar to those in FIG. 1 and thereafter the phase control is carried out.

According to the aforementioned majority-decision determining method using the plurality of results of decisions, the data string to be accessed before the commencement of the phase synchronization stands in need of an increase in length. However, the accuracy of estimating the data can be improved with the result that the accuracy of phase detection can be enhanced. Since the feedback circuit is not configured even in the present embodiment, the phase detecting circuit, which provides a feature of the present invention, can be operated at high speed.

When a phase-synchronized or phase-locked wave in which a dc component has been mixed into sampled data, is now inputted to the phase-locked loop, the sign decision circuit 20 tends to produce an error in the data decision because it makes the data decision based on the polarity of the input signal. As a result, the estimated data string generating circuit 10 also produces an error thereby to cause an incorrect phase difference detection. An estimated data string generating circuit 10 capable of performing a stable phase detection on the signal including the dc component to cope with this inconvenience will be shown in FIG. 6. The first embodiment provides a configuration wherein a filter for eliminating the dc component included in the sampled data is provided on the basis of the estimated data string generating circuit 10 shown in FIG. 1. In the drawing, the filter comprises a delay circuit 40 and a subtraction circuit 41. A frequency characteristic F(jw) of the filter can be given by the following Equation 2:

$$F(jw)=1-\exp(-j*w*T) \qquad [\text{Equation 2}]$$

In Equation 2, j indicates a unit complex number, w indicates an angular frequency, and T indicates a sampling period. From Equation 2 the angular frequency w becomes equal to 0, i.e., F(O)=0 in the case of dc. It is thus understood that the filter provides the effect of eliminating the dc voltage. The sign decision circuit 20 makes a sign decision using sampled data transmitted through the filter. The elimination of the dc component under the above construction enables an improvement in the data decision accuracy and the combination of data string estimates makes it possible to provide a further improvement in the stability of the phase detecting operation.

The present embodiment shows the case where the filter is provided on the basis of the estimated data string generating circuit 10 shown in FIG. 1. It is however needless to say that the first embodiment can be applied to the estimated data string generating circuit 10 using the majority-decision determining method shown in FIG. 4.

Figure 7:
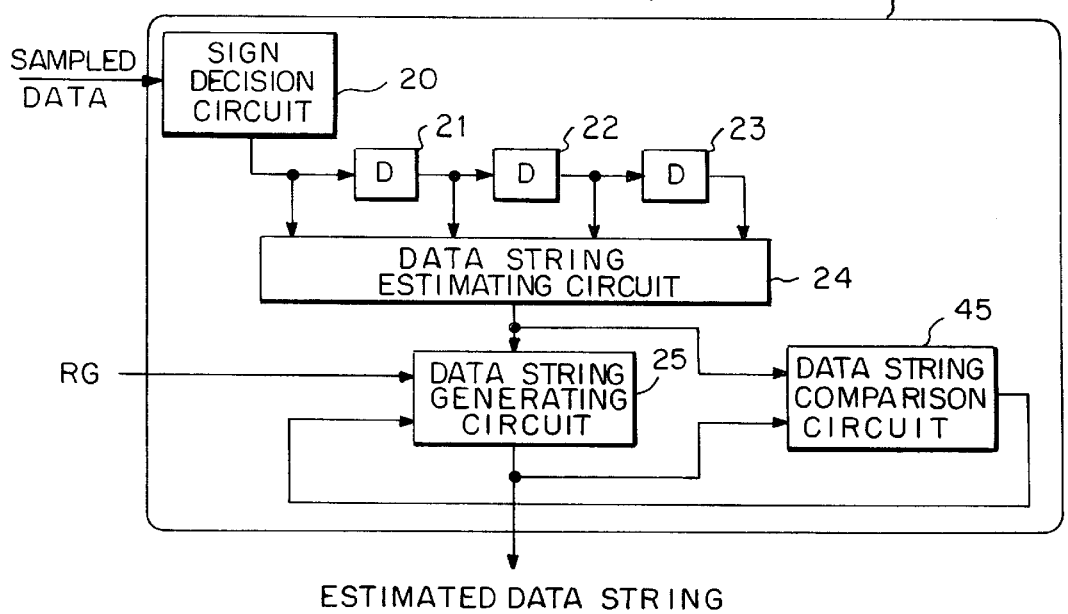
FIG. 7 is a block diagram illustrating a still further example of the estimated data string generating circuit.

One embodiment for avoiding a malfunction or failure that occurs after the estimation of the data string will now be shown in FIG. 7. The present embodiment also provides a configuration wherein the failure in the data string estimation is avoided on the basis of the estimated data string generating circuit 10 shown in FIG. 1. A data string estimating circuit 24 estimates data strings from the result of sign decision on sampled data by a sign decision circuit 20 and the results of delay sign decisions by delay circuits 21 through 23. After RG has changed from "L" to "H", a data string generating circuit 25 repeatedly generates the estimated data strings.

If the data string generating circuit 25 malfunctions and the generated data string is 180 out of phase with the input sampled data string, then a phase detecting circuit is operated in a region having a negative inclination in the phase comparison characteristic shown in FIG. 12. Thus, a problem arises that time is spent in making the phase synchronization. To cope with the problem, a data string comparison circuit 45 is provided for judging whether each of the estimated data strings repeatedly generated from the data string generating circuit 25 and each of the data estimated by the data string estimating circuit 24 is 180 out of phase with each other after the estimated data strings have been determined.

When they are 180 out of phase with each other, e.g., when all the bits are inverted as in the case of the data string estimating circuit 24=(1, 1, −1, −1) and the data string generating circuit 25=(−1, −1, 1, 1), the data string comparison circuit 45 outputs a reset signal for setting the result of data string estimation produced from the data string estimating circuit 24 to the data string generating circuit 25 to the data string generating circuit 25 again. Based on the produced signal, the data string generating circuit 25 resets the result of data-string estimation sent from the data string estimating circuit 24 and repeatedly generates the estimated data strings. The provision of the data string comparison circuit 45 referred to above permits the limitation of an extension of a phase-locking or synchronizing time to a minimum.

The aforementioned phase-locked operation type phase detecting circuit 3 estimates the data string and detects the phase difference based on the sampled data outputted from the AD converter 1. However, the phase detecting circuit 3 may estimate the data string and detect the phase difference based on the equalized data outputted from the equalizer 2.

Figure 8:
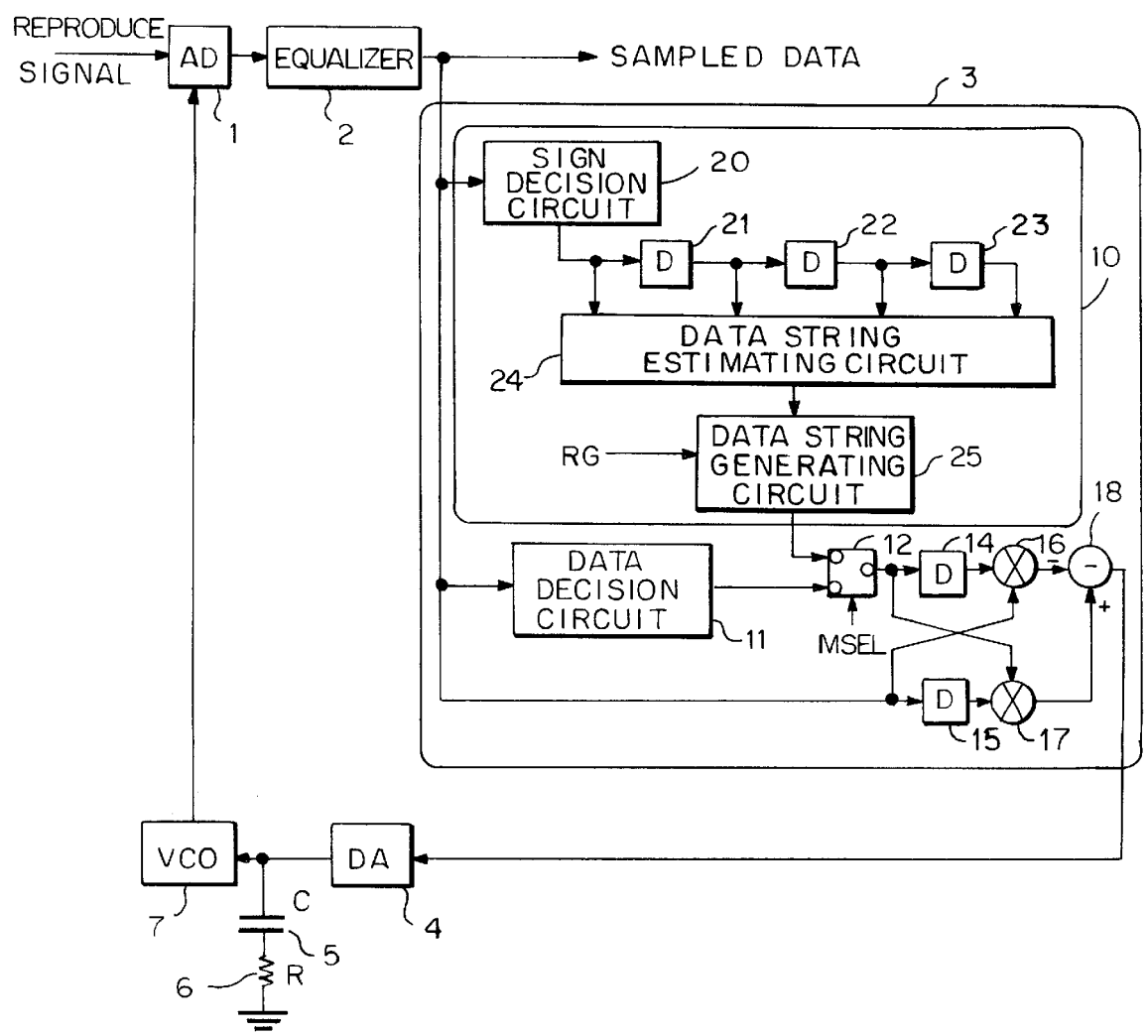
FIG. 8 is a block diagram illustrating a second embodiment of a phase-locked loop according to the present invention.

A second embodiment of such a phase-locked loop will be described relative to FIG. 8. An estimated data string generating circuit 10 is identical in configuration and operation to that shown in FIG. 1 except that a data string is estimated based on equalized data outputted from an equalizer 2. Since a phase-locked data string has a periodic waveform, the equalized data is represented as a signal amplitude obtained by multiplying the sampled data by a predetermined gain. Thus, the decision of polarity by a sign decision circuit 20 can be done with the same accuracy as when the polarity decision is made based on the equalized data or based on the sampled data outputted from an AD converter 1.

From the above description, the estimation of each data string is done by delay circuits 21 through 23 and a data string estimating circuit 24 after the sign decision has been carried out by the sign decision circuit 20 based on the equalized data. After RG has changed from "L" to "H" (i.e., RG="L"→"H"), a data string generating circuit 25 successively generates the estimated data strings. The resultant data strings and the equalized data are computed and the computed data is outputted to a DA converter 4 as a phase difference. Subsequently, a sampling clock is generated by a filter circuit composed of a capacitor 5 and a resistor 6 and a VCO 7.

The phase-locked loop according to the second embodiment brings about the following features. In the first embodiment shown in FIG. 1, the phase difference occurs in the equalized data of the equalizer 2 due to the phase characteristic of the equalizer 2 even if phase lock operation is completed. It is therefore necessary to perform phase re-synchronization by the phase characteristic of the equalizer 2 upon switching of the phase lock operation to the phase follow-up operation. According to the second embodiment on the other hand, since the estimation of the data string and the phase detection are performed based on the equalized data of the equalizer 2, no phase re-synchronization is produced so that the phase-locking time can be shortened. In addition, a high-speed and stable phase difference detecting circuit that shows a feature of the present invention, can be also provided.

Figure 9:
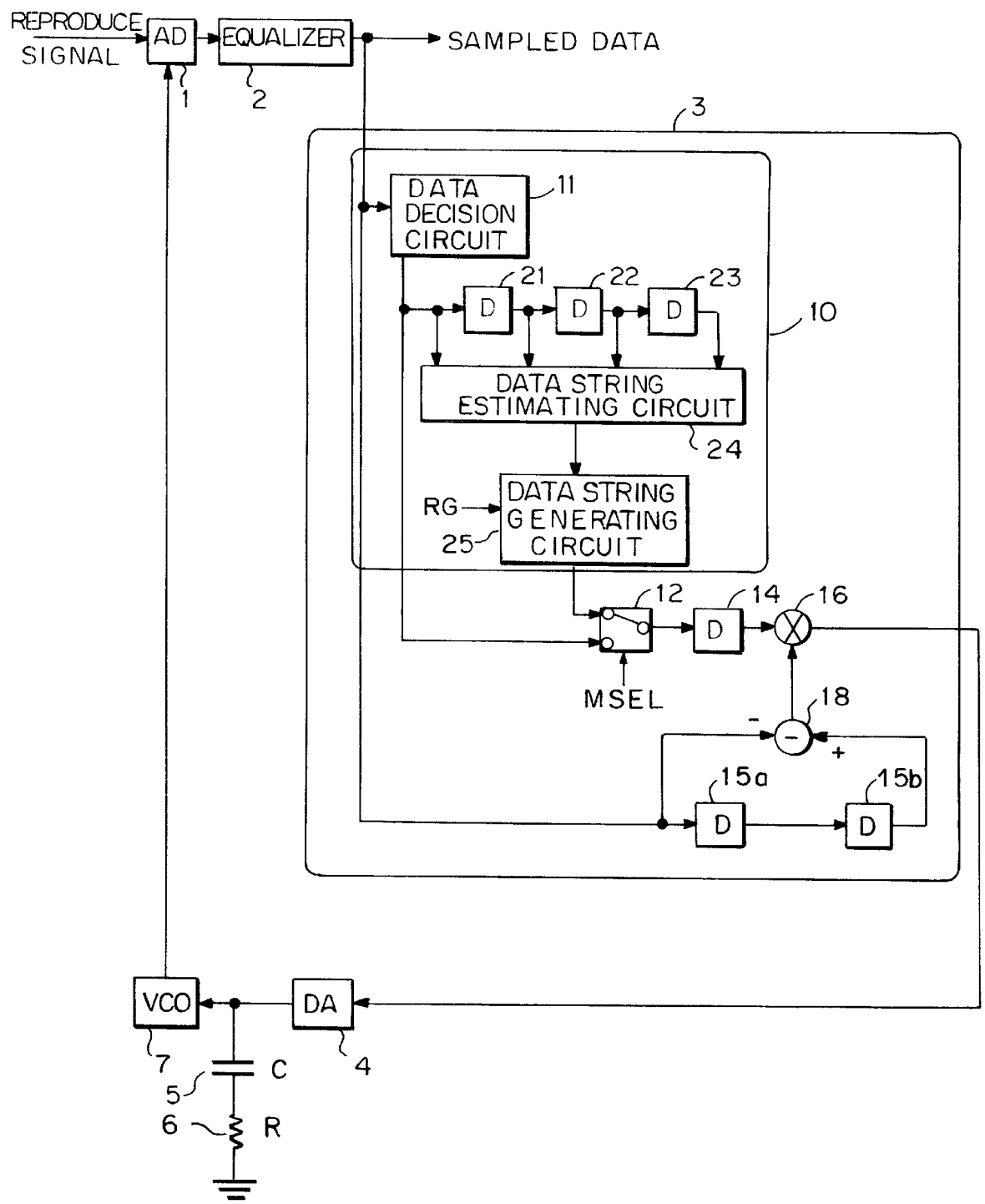
FIG. 9 is a block diagram illustrating a third embodiment of a phase-locked loop according to the present invention.

A third embodiment of a phase-locked loop in a signal reproduction-system circuit of Class EPR-4 (1, 1, −1, −1) will now be described with respect to FIG. 9. A phase-locked data string employed in the EPR-4 (1, 1, −1, −1) signal reproduction-system circuit is equivalent to repetitive data of a (1, 0, −1, 0) signal and is different from the aforementioned phase-locked data string of PR-4 (1, 0, −1). Accordingly, an estimated data string generating circuit 10 is identical in function to the aforementioned PR-4 (1, 0, −1) type. However, the phase-locked data string to be generated differs from the above one because of the repetitive data of (1, 0, −1, 0).

Each of the phase-locked data strings is estimated by a data string estimating circuit 24 based on the results of data decisions on four samples obtained from a data decision circuit 11 and delay circuits 21, 22 and 23. The data string estimating circuit 24 estimates each data string from the results of data decisions on the three values (1, 0, −1) of the four samples in accordance with a truth-value table shown in FIG. 13. When RG changes from "L" to "H" (i.e., RG="L"→"H"), the estimated data string is repeatedly generated from a data string generating circuit 25. The data string estimated in this way is sent to a phase-difference arithmetic circuit through a selector 12 upon phase lock operation. The phase-difference arithmetic circuit comprises delay circuits 14, 15a and 15b and a subtracter 18. The phase-difference arithmetic circuit calculates a sampling phase difference z(n) in accordance with an arithmetic expression given by the following Equation 3:

$$z(n)=\hat{y}(n-1)*\{y(n-2)-y(n)\}$$ [Equation 3]

In order to reduce the phase difference calculated from the arithmetic expression, phase control is executed using a DA converter 4, a capacitor 5, a resistor 6 and a VCO 7 to complete the phase lock operation. A phase follow-up operation subsequent to the phase lock operation is done based on equalized data outputted from an equalizer 2 and the result of data decision by the data decision circuit 11.

According to the third embodiment, the high-speed and stable phase-locked loop can be made available even to the EPR-4 (1, 1, −1, −1) signal reproduction-system circuit.

According to the data string decision made in the third embodiment, the data string estimates have been set so as to correspond to all the results of data decisions as shown in FIG. 13. However, when the result of data decision sgn(n) mismatches with the result of data-string estimation ŷ(n), the phase detection may be temporarily stopped so as to prevent the phase lock operation from being brought into an abnormal condition. Further, a data reproduce operation may be stopped by notifying the above result of data decision to an external control circuit. The phase detection can be performed stabler owing to the provision of such a construction.

Figure 10:
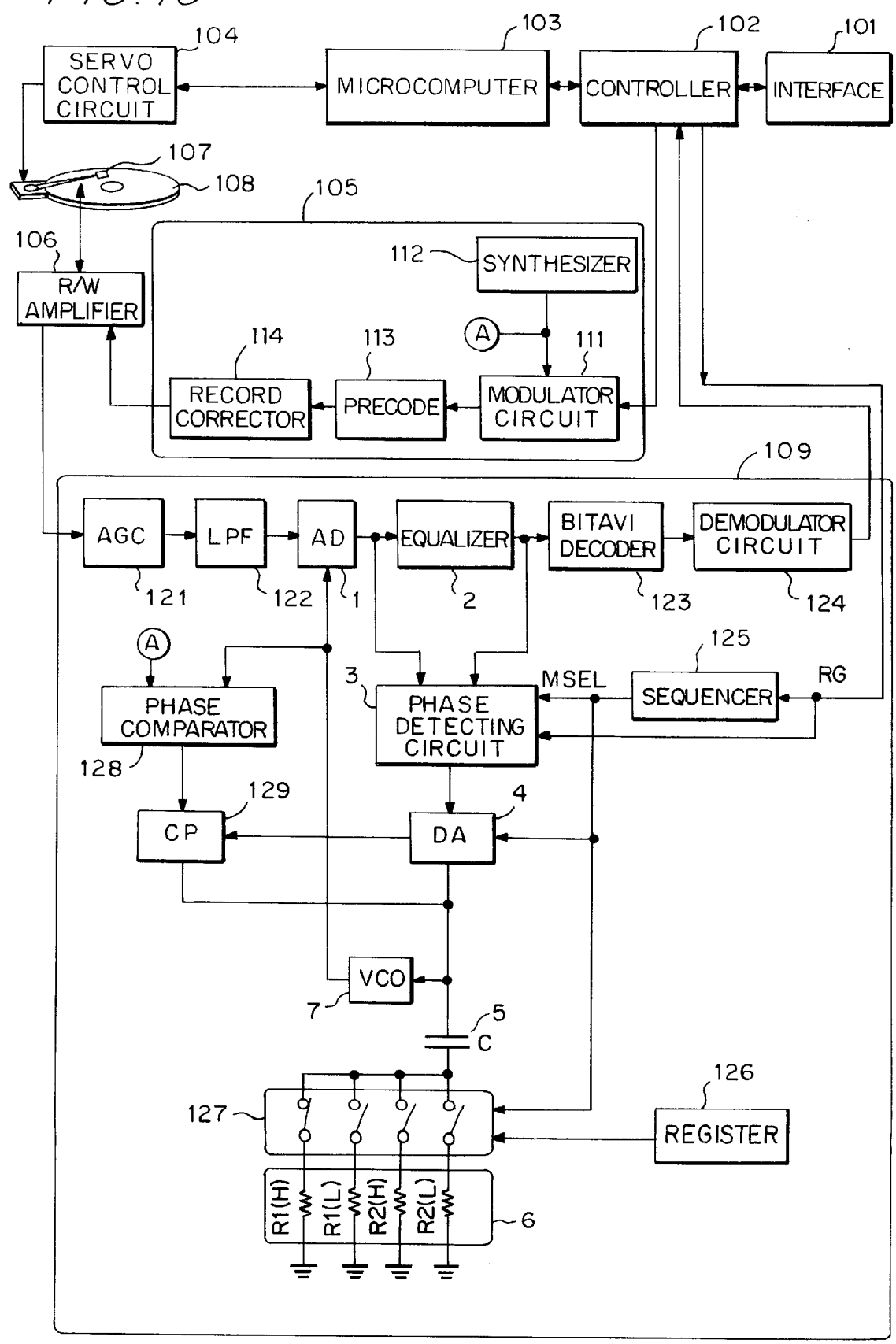
FIG. 10 is a block diagram showing a magnetic recording and reproducing device using a phase-locked loop according to the present invention.

A magnetic recording and reproducing device using a phase-locked loop according to the present invention will next be shown in FIG. 10. Configurations of both the magnetic recording and reproducing device that has carried out isopycnic recording for holding the recording density constant over the inner and outer peripheries and the phase-locked loop will be described in particular. All the phase detecting circuits 3 referred to above can be adopted. However, the phase detecting circuit 3 shown in FIG. 1 will be described herein.

In FIG. 10 reference numeral 101 indicates an interface to a host computer. Reference numeral 102 indicates a controller for controlling the entire magnetic recording and reproducing device. Reference numeral 107 indicates a recording and reproducing head. Reference numeral 108 indicates a data recording medium. Reference numeral 105 indicates a data recording circuit. Reference numeral 109 indicates a data reproducing circuit.

The operation of the magnetic recording and reproducing device will be described below. The operation for recording data generated through the interface is under the control of the controller 102. First of all, the recording and reproducing head 107 is shifted to a data recording position by a microcomputer 103 and a servo control circuit 104. After the recording and reproducing head 107 has been shifted to the recording position, the recording data is outputted to a R/W amplifier 106 through the data recording circuit 105 so as to be recorded on the data recording medium 108. The data recording circuit 105 comprises a synthesizer 112 for generating a reference clock corresponding to a recording frequency therefrom, a modulator circuit 111 for performing coding, a precode 113 and a record corrector 114 for reducing a nonlinear characteristic at recording.

On the other hand, the data to be reproduced is sent to the interface 101 through the R/W amplifier 106, the data reproducing circuit 109 composed of a plurality of components, and the controller 102. The data reproducing circuit 109 will now be described in detail. After the signal reproduced by the recording and reproducing head 107 has been amplified by a predetermined gain with the R/W amplifier 106, an automatic gain control (AGC) circuit 121 stabilizes the amplitude of the signal. Next, a low-pass filter (LPF) 122 eliminates signal out-of-band noise from the signal. Thereafter, the so-processed data is reproduced through the AD converter 1, the equalizer 2 and the phase detecting circuit 3 referred to above and a Viterb decoder 123 for decoding the data and a demodulator circuit 124. Now, RG and MSEL signals for determining an operation mode of the phase detecting circuit 3 are generated by the controller 102 and a sequencer 125. The following operations will be performed in accordance with the combination of the RG and MSEL signals.

(1) Reference Lock or Synchronous Operation (RG="L", MSEL=irrelevant):

In this operation mode, the operation for reproducing the data is stopped and only the phase detecting circuit 3 estimates a data string. As a condition for allowing the phase detecting circuit 3 to estimate the data string with high accuracy, the ratio of the frequency of a reproduce signal to the frequency of a sampling clock needs about 1:4. Therefore, the sampling clock is defined as a clock synchronized with a clock frequency generated from the synthesizer 112 in accordance with the reference synchronous operation. Such a phase-locked loop comprises a phase comparator 128 for measuring the difference in phase between the reference clock of the synthesizer 112 and the sampling clock of a VCO 7, a charge pump 129 for outputting the phase difference as a current, a capacitor 5 and a resistor 6 constituting a filter, and the VCO 7 for generating the sampling clock therefrom. Thus, the same sampling clock as the reference clock frequency of the synthesizer 112 is generated and the estimation of each data string is performed with high accuracy.

(2) Phase lock operation (RG="H", MSEL="H"):

This operation mode is equivalent to a mode for synchronizing the reproduce signal in phase with the sampling clock prior to the data reproducing operation. This operation is identical to the one described in FIG. 1.

(3) Phase follow-up operation (RG="H", MSEL="L"):

This operation mode is equivalent to a mode for performing the data reproducing operation. This operation is also identical to the one described in FIG. 1.

The phase-locked loop according to the present embodiment is provided so as to correspond to the isopycnic recording. The frequency of the sampling clock generated from the VCO 7 and the frequency of the reference clock of the synthesizer 112 are different in the inner and outer peripheries from each other. Correspondingly, a characteristic of the phase-locked loop stands in need of change. Described specifically, the cutoff frequency of the filter of the phase-locked loop is varied depending on the sampling clock frequency. Further, the cutoff frequency of the filter at the phase synchronous operation is raised and a phase locking or synchronizing time is shortened.

To realize the above operation, only the corresponding switch 127 is brought into conduction according to the setting of a register 126 and the state of the MSEL signal so that the cutoff frequency is varied according to a selected resistor 6 and a capacitor 5. In the embodiment illustrated in FIG. 10, R1(H), R1(L), R2(H) and R2(L) correspond to an inner-periphery side phase synchronous/reference synchronous operation, an inner-periphery side phase follow-up operation, an outer-periphery side phase synchronous/reference synchronous operation and an outer-periphery side phase follow-up operation respectively. The phase locking or synchronizing method of the present invention can be applied to the magnetic recording and reproducing device having the aforementioned data recording and reproducing circuit. As a result, the speeding up of the data recording and reproducing circuit can be achieved and high-speed transfer of the magnetic recording and reproducing device can be implemented.

The embodiment illustrated in FIG. 10 shows the case where the cutoff frequency of the filter is changed according to the change in the resistance value of the resistor. However, similar operation can be achieved even when the capacity of the capacitor is changed as an alternative to the above.

Further, the embodiment illustrated in FIG. 10 shows the case where the cutoff frequency of the filter is changed under phase lock operation and phase follow-up operation. However, the cutoff frequency of the filter may be changed even during phase lock operation. Further, the order of the filter, e.g., a filter composed of a resistor alone and a filter composed of a resistor and a capacitor may be switched therebetween. Now, the timing for performing the switching therebetween may be provided within the phase lock operation or the phase follow-up operation transitioned from the phase lock operation.

Figure 11:
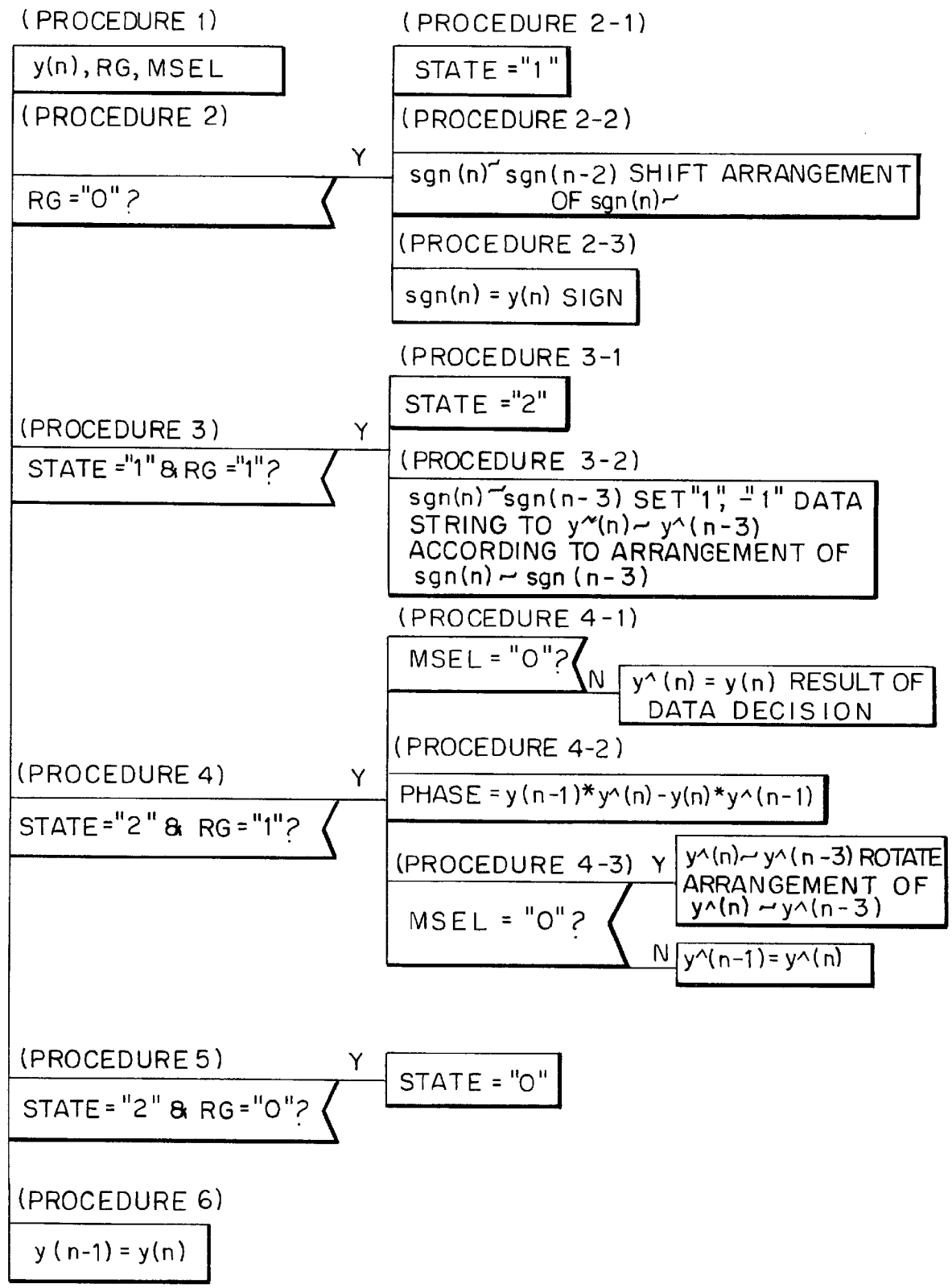
FIG. 11 is a flowchart in PAD view style illustrating a phase-difference detecting method according to the present invention.

The phase detecting method of the present invention as described above relative to the above-described embodiments can be performed by a computer program as will now be described below. FIG. 11 is a flowchart in PAD view style showing procedures for executing the phase detecting method of the present invention.

(Procedure 1):

Sampling data y(n) and operation control variables RG and MSEL are inputted. The state of an internal status variable state and the state of the operation control variable RG are judged. If the result of judgement is found to be true, then the following processing is executed.

(Procedure 2):

It is judged whether the operation control variable (Procedure 2-1):

The internal status variable state is set to "1" (i.e., state=1").

(Procedure 2-2):

An arrangement of sgn(n−1) through sgn(n−3) is shifted to the left. (sgn(n−2)→sgn(n−3), sgn(n−1)->sgn(n−2), sgn(n)→sgn(n−1)) (Procedure 2-3):

The sign of the sampling data y(n) is set to sgn(n).

(Procedure 3):

It is judged whether the internal status variable state="1" and the operation control variable RG="1".

(Procedure 3-1):

The internal status variable state is set to "2" (i.e., state="2").

(Procedure 3-2):

Estimated data strings associated with the contents of sgn(n) through sgn(n−3) are set to their corresponding arrangements y^(n) through y^(n−3).

(Procedure 4):

It is judged whether the internal status variable state="2" and the operation control variable RG="1".

(Procedure 4-1):

When the operation control variable MSEL is unequal to 0 (i.e., MSEL "0"), the result of decision on the sampling data is substituted in the variable y^(n).

(Procedure 4-2):

A phase difference is calculated from the performance of an arithmetic computation on y(n−1)*y^(n)−y(n)*y^(n−1).

(Procedure 4-3):

When the operation control variable MSEL="0", an arrangement of estimated data sequences or strings y^(n) through y^(n−3) is rotated to the left.

{y^(n)→y^(n−1)→y^(n−2)→y^(n−3)→y^(n)}

When the operation control variable MSEL "0", y^(n) is substituted in the variable y^(n−1).

(Procedure 5):

It is judged whether the internal status variable state="2" and the operation control variable RG="0".

(Procedure 5-1):

"0" is substituted into the internal status variable state.

(Procedure 6):

y(n) is substituted in the sampled data y(n−1).

Since the phase detecting method using the aforementioned procedures eliminates the need for judging the previous result of decision so as to switch between processes, the phase detecting method minimizes the potential of disturbing the processing of the program. Accordingly, the phase detecting method permits high-speed processing of the phase-difference detecting program.

According to the present invention, an improvement in the accuracy of phase detection owing to an improvement in the accuracy of data judgement and the speeding up of the phase detecting circuit can be achieved. Further, the phase comparison characteristic obtained in the present invention has a linearity of ±π [rad] or more and is an improvement when compared with the conventional phase comparison characteristic.

While the present invention has been described in detail and pictorially in the accompanying drawings it is not limited to such details since many changes and modifications recognizable to those of ordinary skill in the art may be made to the invention without departing from the spirit and the scope thereof.

We claim:

1. A phase-locked loop device for generating a sampling clock with respect to an input signal, comprising:

a sampling circuit for sampling the input signal;

a data determining circuit for determining data by comparing an amplitude of the signal sampled by said sampling circuit and an amplitude of a reference signal;

a data string estimating circuit for estimating a data string which is made by subsequent data based on said data determined by said data determining circuit;

a phase difference generating circuit for performing an arithmetic operation on the input signal and the data string estimated by said data string estimating circuit to generate a phase difference signal;

a filter for filtering a phase difference signal generated by said phase difference generating circuit; and a variable oscillator for varying the frequency of a sampling clock supplied to said sampling circuit in response to the output of said filter.

2. A device according to claim 1, wherein said data determining circuit, said data string estimating circuit and said phase difference generating circuit implement successively-processing feed-forward processes.

3. A phase-locked loop device according to claim 1, wherein said phase-locked loop device is formed on a semiconductor integrated circuit chip.

* * * * *